(12) United States Patent
Kao et al.

(10) Patent No.: US 10,190,209 B2
(45) Date of Patent: Jan. 29, 2019

(54) PVD APPARATUS AND METHOD WITH DEPOSITION CHAMBER HAVING MULTIPLE TARGETS AND MAGNETS

(71) Applicant: Taiwan Semiconductor Manufacturing Co., Ltd., Hsin-Chu (TW)

(72) Inventors: Chung-En Kao, Miaoli County (TW); Ming-Chin Tsai, Hsinchu (TW); You-Hua Chou, Hsinchu (TW); Chen-Chia Chiang, Miaoli County (TW); Chih-Tsung Lee, Hsinchu (TW); Ming-Shiou Kuo, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 22 days.

(21) Appl. No.: 15/651,639

(22) Filed: Jul. 17, 2017

(65) Prior Publication Data
US 2017/0314121 A1     Nov. 2, 2017

Related U.S. Application Data

(62) Division of application No. 13/307,242, filed on Nov. 30, 2011, now Pat. No. 9,708,706.

(51) Int. Cl.
*C23C 14/35*     (2006.01)
*H01J 37/34*     (2006.01)

(52) U.S. Cl.
CPC ........ *C23C 14/352* (2013.01); *H01J 37/3405* (2013.01); *H01J 37/3417* (2013.01)

(58) Field of Classification Search
CPC .............. C23C 14/352; C23C 14/3492; C23C 14/3464
See application file for complete search history.

(56) References Cited

U.S. PATENT DOCUMENTS

| | | | |
|---|---|---|---|
| 4,198,283 A | 4/1980 | Class et al. | |
| 5,328,582 A | 7/1994 | Cole | |
| 6,197,165 B1 | 3/2001 | Drewery et al. | |
| 6,506,290 B1 | 1/2003 | Ono | |
| 6,579,424 B2 | 6/2003 | Cord et al. | |

(Continued)

FOREIGN PATENT DOCUMENTS

| | | | |
|---|---|---|---|
| CN | 101720493 A | 6/2010 | |
| JP | S61243171 A | 10/1986 | |

(Continued)

OTHER PUBLICATIONS

Office Action dated Sep. 27, 2013 issued in corresponding Korean Patent Appliation No. 10-2012-0012482, 14 pages.

(Continued)

*Primary Examiner* — Joel G Horning
(74) *Attorney, Agent, or Firm* — Duane Morris LLP

(57) ABSTRACT

A thin film deposition system and method provide for multiple target assemblies that may be separately powered. Each target assembly includes a target and associated magnet or set of magnets. The disclosure provides a tunable film profile produced by multiple power sources that separately power the target arrangements. The relative amounts of power supplied to the target arrangements may be customized to provide a desired film and may be varied in time to produce a film with varied characteristics.

20 Claims, 4 Drawing Sheets

(56) References Cited

U.S. PATENT DOCUMENTS

| | | |
|---|---|---|
| 2008/0308412 A1 | 12/2008 | Rohrmann |
| 2009/0205949 A1 | 8/2009 | Zueger |
| 2010/0032289 A1 | 2/2010 | Wang |
| 2013/0043120 A1 | 2/2013 | Chueh |

FOREIGN PATENT DOCUMENTS

| | | |
|---|---|---|
| JP | H111772 A | 1/1999 |
| JP | 2000-144399 A | 5/2000 |
| JP | 2002-538309 A | 11/2002 |
| KR | 10-2010-0040855 | 4/2010 |
| WO | 00-52734 A1 | 9/2000 |

OTHER PUBLICATIONS

Official Action dated Jun. 25, 2013, in counterpart Korean Patent Application No. 10-2012-0012482.

PVD APPARATUS AND METHOD WITH DEPOSITION CHAMBER HAVING MULTIPLE TARGETS AND MAGNETS

CROSS-REFERENCE TO RELATED APPLICATIONS

This application is a divisional of U.S. patent application Ser. No. 13/307,242, filed on Nov. 30, 2011, and entitled "PVD APPARATUS AND METHOD WITH DEPOSITION CHAMBER HAVING MULTIPLE TARGETS AND MAGNETS," the contents of which is hereby incorporated by reference as if set forth in its entirety.

TECHNICAL FIELD

The disclosure relates, most generally, to semiconductor manufacturing tools and methods. More particularly, the disclosure relates to a physical vapor deposition (PVD) apparatus and method with a multi-target design in which different targets are powered by separately controllable power sources and deposit different materials onto a substrate.

BACKGROUND

Sputtering and other types of physical vapor deposition (PVD) are commonly used in the semiconductor manufacturing industry to deposit films on substrates. PVD is a deposition process that takes place in the gas phase in which a source material is physically transferred to a substrate in a vacuum. PVD includes thermal and e-beam evaporation in addition to sputtering. PVD is commonly used to deposit metals, barrier materials and oxides. The source material is typically present in a target which acts as a cathode in the deposition operation.

In sputtering cathodes, the source material provided in the form of a target is eroded by energetic ions from a plasma discharge and the material liberated by the ions deposits as a thin film on the substrate via physical vapor deposition, PVD. The plasma discharge is generally maintained in an evacuated process chamber, i.e., a vacuum chamber, under controlled flow of a working gas with an electric potential and discharge current applied by a power supply between the target cathode and an anode.

In the case of electrically conductive target materials, the target may be supplied with a continuous or pulsating negative voltage, such that a plasma forms above the target surface. By means of an electrical field formed between the plasma and target surface, positively charged ions from the plasma are accelerated toward and onto the negatively biased target surface, i.e., the cathode, bombarding the target surface and causing erosion of the target by freeing materials from the target and resulting in material being sputtered away from the target surface. The liberated material from the eroding target is directed to a substrate such as a semiconductor substrate or other workpiece positioned in the deposition chamber.

In magnetron sputtering systems, the plasma density above the target is strongly increased by means of magnetic fields. Ions in the high plasma density region produced by the magnetic field, become highly energized. The magnetic fields are produced by a magnet arranged in close proximity to the target. The magnet is typically disposed on the side of the target opposite the target sputtering surface, i.e. behind the target.

In conventional magnetron sputtering systems, however, the target will have an uneven erosion profile. Regardless of its shape, the target erodes more preferentially at specific locations with respect to the fixed magnetic fields of the magnet. The uneven erosion profile of the target may result in poor uniformity of the deposited film and uneven film characteristics across the substrate. For example, poor step coverage may be achieved at some spatial locations of the substrate while good step coverage may be achieved at other areas of the substrate.

In today's rapidly advancing semiconductor manufacturing industry and with semiconductor devices having increasingly miniaturized features, it has become increasingly important to overcome the shortcomings of the art and provide deposited thin films with superior uniformity and consistent qualities.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
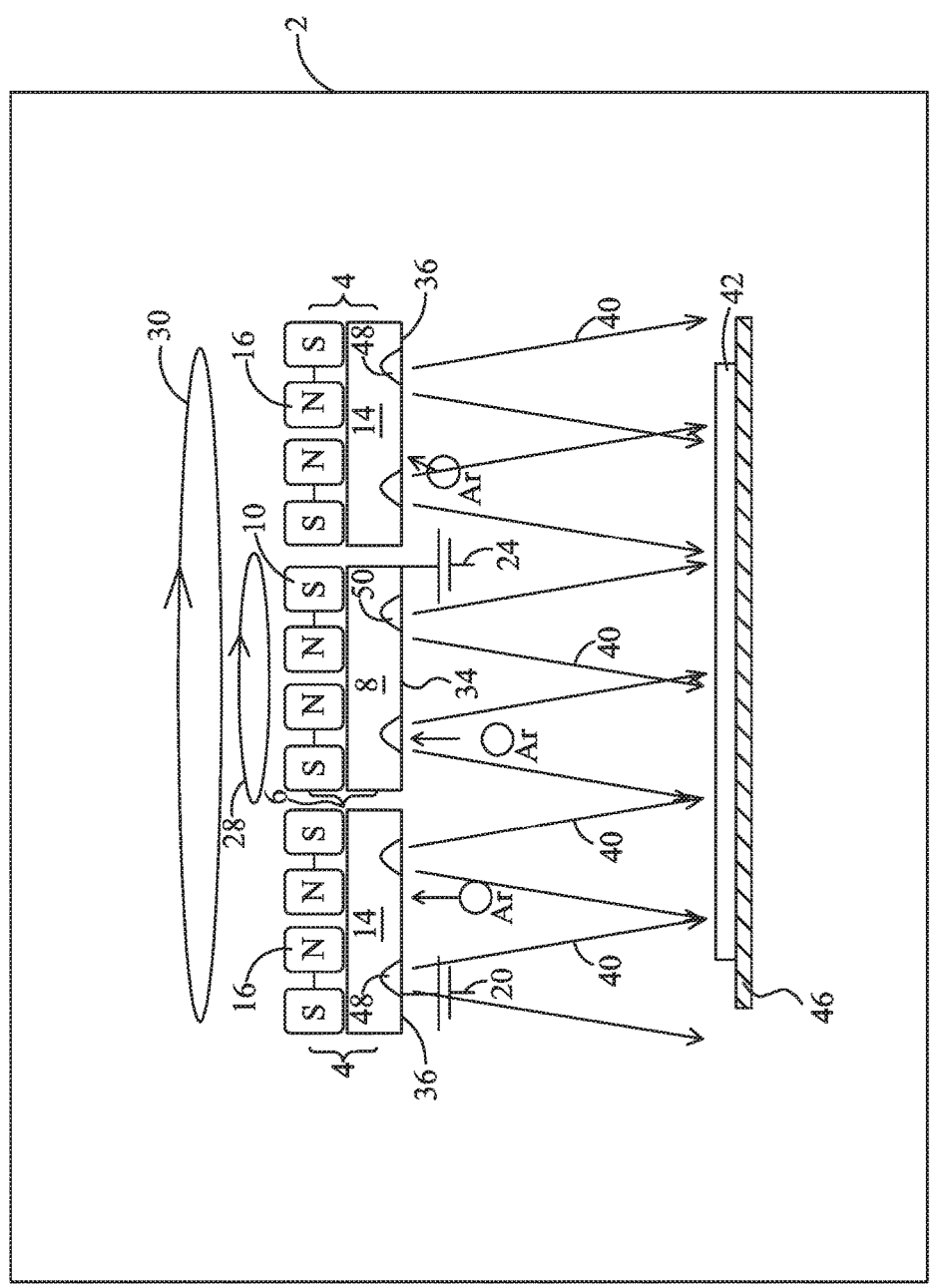
FIG. 1 is an embodiment of a schematic view of a PVD target magnet arrangement in a deposition chamber in accordance with the disclosure.

FIG. 1 is a schematic view showing an embodiment of a process chamber arrangement according to the disclosure. Process chamber 2 is representative of a PVD deposition chamber in a PVD deposition tool and may be a magnetron sputter deposition process chamber according to one exemplary embodiment. The PVD deposition tool may include a plurality of process chambers 2. Process chamber 2 may advantageously be a vacuum chamber capable of being accurately maintained at low pressures. Process chamber 2 may also include inlet and outlet ports for the controlled flow of a working gas, typically argon or other inert gases, but such ports are not shown in FIG. 1 and various other gases may be used. Process chamber 2 may take on various configurations and the illustration of FIG. 1 is intended to be exemplary only.

Process chamber 2 is a deposition chamber that includes a target arrangement consisting of a plurality of target assembly embodiments such as target assembly 4 and target assembly 6. Target assembly 6 is centrally disposed within process chamber 2 and target assembly 4 is an annular target assembly that surrounds target assembly 6. Both of the opposed sides of target assembly 4 are illustrated in cross-section in FIG. 1. Target assembly 6 includes target 8 and associated magnet 10. Target assembly 4 includes target 14 and associated magnet 16. According to one embodiment, targets 8 and 14 are formed of different materials. Either or both of targets 8 and 14 may be formed of various suitable conductive materials used in the semiconductor manufacturing industry, according to one embodiment. Targets 8 and 14 may be formed of a single material or binary or ternary materials, in various exemplary embodiments. According to various exemplary embodiments, the materials of targets 8 and 14 may be copper, copper oxide, copper silicon, copper aluminum, copper manganese, copper aluminum silicon, aluminum, aluminum copper, aluminum silicon, aluminum silicon copper, aluminum nitride, aluminum oxide, antimony, antimony telluride, barium, barium ferrite, barium titanate, barium fluoride, barium strontium titanate, bismuth, bismuth oxide, bismuth selenide, bismuth telluride, bismuth titanate, boron, boron nitride, boron carbide, cadmium, cadmium selenide, cadmium sulfide, cadmium telluride, carbon, cerium, cerium fluoride, cerium oxide, chromium, chromium oxide, chromium salicide, cobalt, cobalt oxide, dysprosium, erbium, europium, gadolinium, germanium, hafnium, hafnium carbide, hafnium nitride, hafnium oxide, holmium, indium, indium oxide, indium tin oxide, iridium, iron, iron oxide, lanthanum, lanthanum aluminate, lanthanum hexaboride, lanthanum oxide, lead, lead telluride, lead titanate, lead zirconate, lead zirconate titanate, lithium niobate, magnesium, magnesium fluoride, magnesium oxide, manganese, manganese oxide, molybdenum, molybdenum carbide, molybdenum disilicide, molybdenum oxide, molybdenum disulfide, neodymium, tungsten, titanium, titanium boride, titanium carbide, titanium monoxide, titanium disilicide, titanium dioxide, titanium nitride, titanium tungsten, TiW, tungsten, tungsten carbide, tungsten oxide, tungsten disilicide, tungsten disulfide, tungsten titanium, tungsten nitride, silver, gold, palladium, platinum, praseodymium, rhenium, rhodium, ruthenium, samarium, selenium, silicon, silicon carbide, silicon dioxide, silicon monoxide, silicon nitride, strontium, strontium titanate, tantalum, tantalum carbide, tantalum nitride, Tantalum oxide, tantalum salicide, tellurium, terbium, tin, tin oxide, nickel, nickel chromium, nickel iron, nickel oxide, nickel vanadium, nickel platinum, niobium, niobium carbide, niobium nitride, niobium oxide, vanadium, vanadium carbide, vanadium oxide, ytterbium, ytterbium oxide, yttrium, yttrium oxide, zinc, zinc oxide, zinc selenide, zinc sulfide, zinc telluride, zirconium, zirconium carbide, zirconium nitride, zirconium oxide, dielectric materials, or other materials. Target assemblies 4 and 6 have separate power sources. Target assembly 4 includes dedicated power source 20 and target assembly 6 includes dedicated power source 24. Power sources 20 and 24 may be RF or DC or other suitable power sources, and may provide pulsating or continuous power.

For target assembly 6, the north "N" and south "S" poles of magnet 10 are shown and clockwise direction 28 indicates the direction that magnet 10 rotates with respect to target 8. Magnet 16 of target assembly 4 also has its respective north and south poles identified and clockwise direction 30 indicates the direction that magnet 16 rotates with respect to target 14 of target assembly 4. In one embodiment, magnet 16 may be an annular or generally round magnet that extends all the way around annular target 14 and in other embodiments, annular target 14 may include a plurality of separate magnets that each rotate along clockwise direction 30 with respect to target 14. Each of target 14 and 8 is in fixed position.

In other exemplary PVD tool embodiments, the magnets may not be present and the process chamber may include multiple separately powered targets configured in various arrangements.

Returning to FIG. 1, materials from surface 34 of target 8 and from surface 36 of target 14 are sputtered from their respective targets due to energized ions such as the illustrated argon atoms, and accelerate as indicated by arrows 40 toward and onto substrate 42. Substrate 42 may be a semiconductor substrate of various sizes according to various exemplary embodiments although other workpieces may be used in other embodiments. Substrate 42 rests on stage 46 which may be a fixed or moveable component of process chamber 2. The erosion profiles of the respective targets 8, 14 is determined or at least influenced by the magnetic poles of the associated magnet. Regardless of its shape, a target erodes more preferentially at specific locations with respect to the magnetic fields that are produced by the magnets such as exemplary magnets 10, 16, particularly when magnet 16 is an annular magnet that rotates while maintaining its north and south magnetic poles as illustrated in FIG. 1. High erosion areas 48, 50 are generally disposed between adjacent north and south magnet poles. The presence of two targets with separately controlled power supplies alleviates any problems such as uniformity problems that may be attributable to the spatially disposed high erosion areas when only a single target is used. This is true because the film deposited on substrate 42 is produced by sputtering from both target assemblies 4 and 6.

Each of the target arrangements 4, 6 is disposed and adapted to deposit a film on the same substrate 42. Various configurations of the target assemblies may be used in addition to the exemplary configuration shown. According to one embodiment, deposition on substrate 42 may occur by simultaneously applying power to both target assemblies 4, 6 using respective, separately controlled power supplies 20, 24. The targets may work in tandem to produce a relatively homogenous film formed of a fairly consistent ratio of material from target 14 and material from target 8. The ratio may be varied by changing the relative amount of power applied to target assemblies 4 and 6. In another embodiment, the various target assemblies 4, 6, may preferentially deposit materials on different spatial locations on substrate 42. According to either embodiment, the relative amount of material sputtered from the respective targets can be varied by varying the power applied to the target assemblies. According to one exemplary embodiment, an initial deposition may occur using a first power ratio, i.e. the relative amount of power applied by power sources 20 and 24. During the initial deposition, the deposited film may be a homogenous or non-homogenous film, with a composition determined by the relative power levels applied to the respective target assemblies 4, 6. After an initial deposition period that forms an initial film thickness, the power ratio may be changed to form a homogenous or non-homogenous film with a different composition. In addition to a power ratio between the two exemplary targets that are simultaneously powered and simultaneously deposit materials, another embodiment provides for time periods in which power is supplied to only one of the targets with the other target sitting idle. Exemplary embodiments of the various deposition techniques will be shown in FIGS. 4A and 4B.

Figure 2:
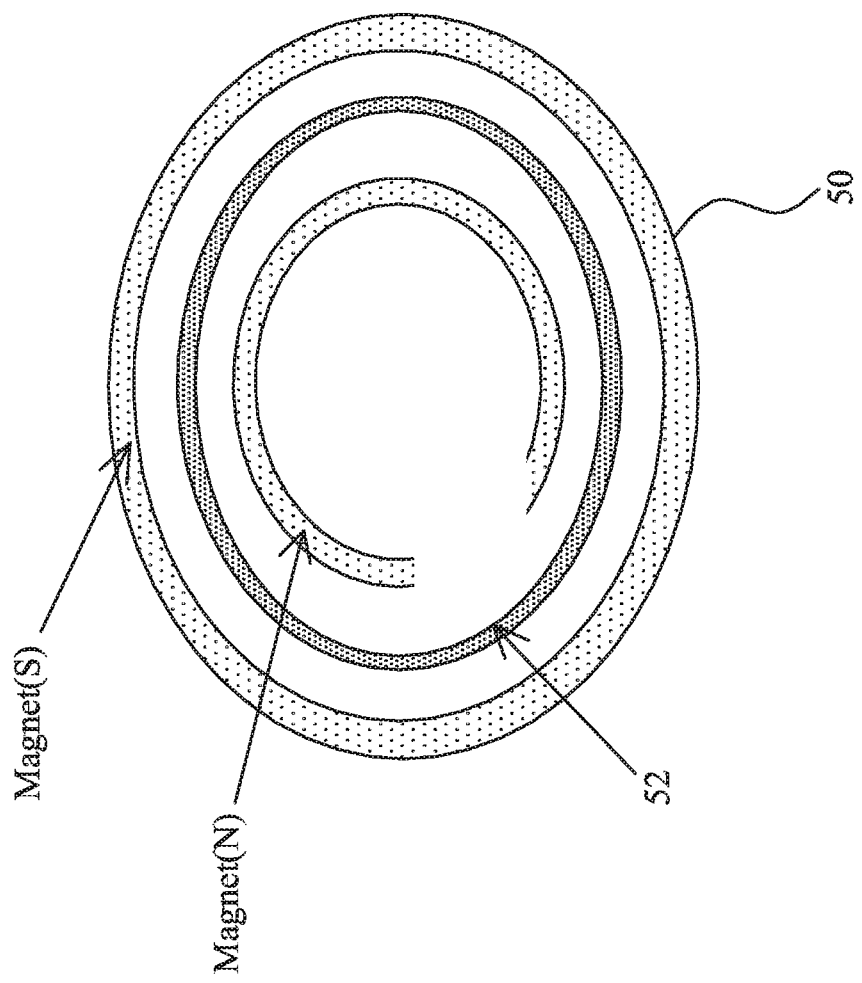
FIG. 2 is a schematic diagram showing magnetic fields according to one embodiment of the disclosure.

FIG. 2 is a schematic view showing an exemplary round magnet 50 with indicated North and South magnetic poles and shows that the maximum magnetic field 52 is disposed between adjacent north and south magnetic poles. When target 50 is disposed along the back surface of a target such as shown in FIG. 1, high erosion areas 48, 50 will be produced at portions of the target aligned with maximum magnetic field 52.

Figure 3:
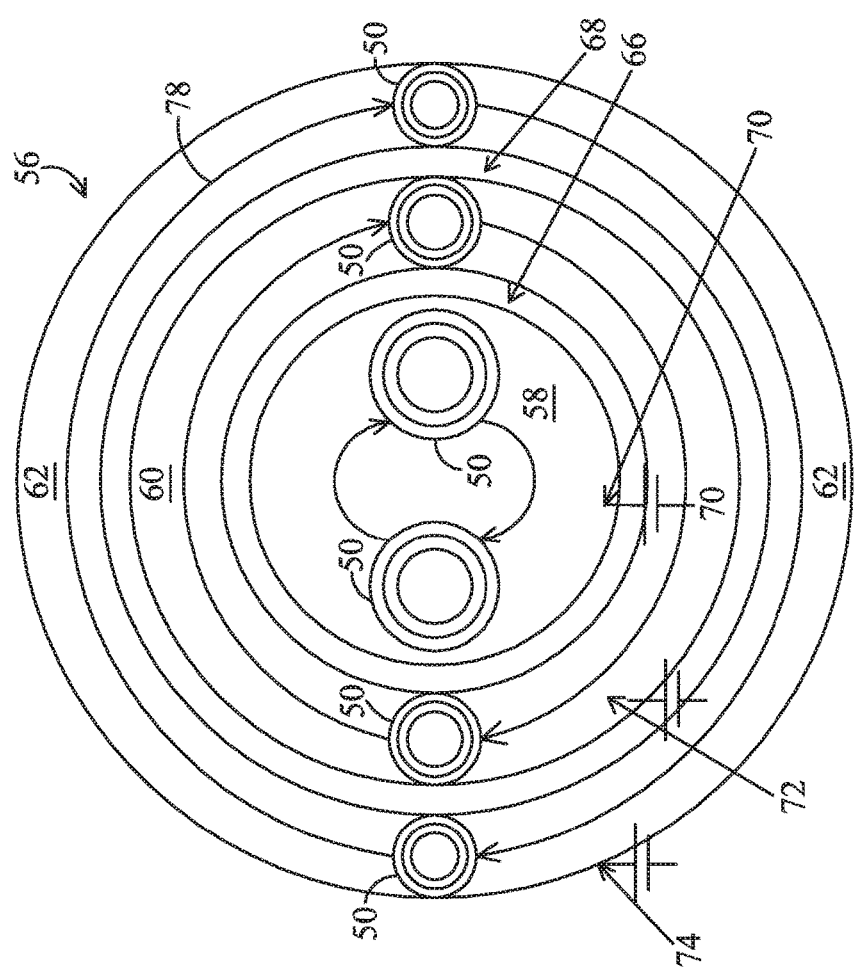
FIG. 3 is an embodiment of a top view of a PVD target and magnet arrangement according to the disclosure.

FIG. 3 is a top view showing a target arrangement according to another embodiment of the disclosure. Target arrangement 56 includes concentrically arranged targets including central target 58, intermediate target 60 and outer target 62. Intermediate target 60 and outer target 62 are both generally circular in shape and this is intended to be exemplary only. Intermediate target 60 and outer target 60 may be ovoid in other embodiments. Isolation regions 66 and 68 are present between the targets to insure that the targets 58, 60, 62 are electrically isolated from one another and therefore can be separately electrically controlled. Power source 70 powers central target 58, power source 72 powers intermediate target 60 and power source 74 powers outer target 62. Each target is separately controlled such that the relative amounts of power supplied to the targets throughout the deposition process can be varied, in order to customize the composition of the deposited film. The relative amount of power applied by power sources 70, 72 and 74 may be varied throughout the deposition process and power sources 70, 72 and 74 may be used simultaneously or at separate times. Power supplies 70, 72 and 74 work independently and may provide DC or RF power according to various exemplary embodiments. In the illustrated embodiment, it can be seen that two magnets 50 are associated with central target 58. Two magnets 50 are also associated with intermediate target 60 and with outer target 62. The respective clockwise arrows such as arrow 78 indicates that the two magnets 50 rotate with respect to their respective target. In other words, each target assembly in FIG. 3 includes a target and an associated set of two dedicated magnets 50 and a separately and independently controllable power supply.

Figure 4B:
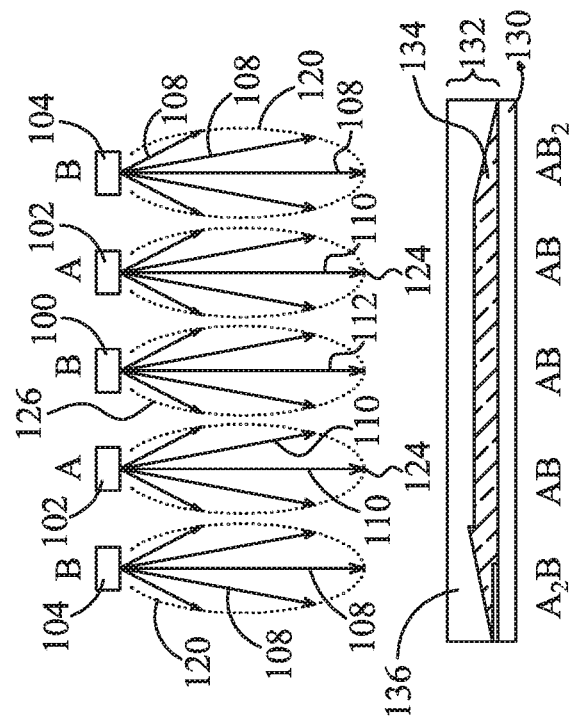
FIGS. 4A and 4B are schematic views each showing an embodiment of a multi-target arrangement and a film produced on a substrate by the associated multi-target arrangement.
Figure 4A:
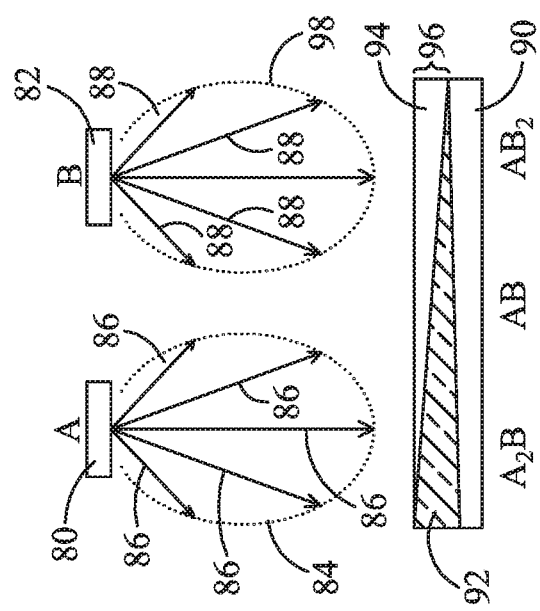

FIGS. 4A and 4B illustrate various advantageous aspects of an embodiment of the disclosure and are presented generally in schematic form. In FIG. 4A, target assemblies 80 and 82 are disposed side by side and each target assembly represents a target and associated magnet or magnets, and power source. Film 96 with film portions 92 and 94 represents a film produced by target assemblies 80 and 82. The target in target assembly 80 is formed of material A and the target in target assembly 82 is formed of material B. Materials A and B may be any of various suitable materials. The deposition zone 84 of target assembly 80 is indicated by arrows 86 which represent material being sputtered from target assembly 80 and the deposition zone 98 of target assembly 82 is indicated by arrows 88 which represent material being sputtered from target assembly 82. Deposition zones 84 and 98 are spatially separated and indicate that target assemblies 80 and 82 preferentially deposit material in different locations on workpiece 90.

Film 96 is formed on workpiece 90 and includes film portion 92 formed of material A from target assembly 80 and film portion 94 formed substantially of material B from target assembly 82. Film 96 may be formed according to a process in which a higher power is applied to target assembly 80 during initial stages in the deposition process such that the lower portions and left-hand side portions of film 96 are preferentially formed of material A, i.e. film portion 92. As the deposition process continues, the relative amounts of power may be changed such that relatively more power is applied to target assembly 82 resulting in the upper portions and right-hand side of film 96 consisting of a higher percentage of material B, i.e. film portion 94. In one exemplary embodiment, only target assembly 80 may be powered initially and only target assembly 82 may be powered during latter stages, while in other exemplary embodiments, power may be continuously provided to both target assemblies 80 and 82 simultaneously. Both material A and material B may represent a single material, a binary material or other composite materials.

In some exemplary embodiments, the target arrangement may be configured such that during any deposition stage, the film produced on substrate 90 is a homogenous film formed of combination of materials A and B in a first ratio, and when the relative power applied to the targets is changed, the ratio of materials A and B in the film which may remain homogenous, may change. In one embodiment, an initial, lower thickness of the deposited film may be homogenous and include components A and B in a 1:5 ratio and an upper thickness of the deposited film may include components A and B in a 5:1 ratio. This is, of course, intended to be for illustrative purposes.

Now turning to FIG. 4B, the illustrated target arrangement may include concentric target assemblies including central target 100, formed of material B, intermediate target 102 formed of material A and outer target 104, formed of material B. Central target 100 may be centrally disposed with intermediate target 102 being annular and surrounding central target 100 with outer target 104 also being annular and surrounding intermediate target 102. This configuration represents one embodiment only and each target 100, 102, 104 represents a target that is part of a target assembly with an associated magnet or magnets, and a separately controllable power source, not shown. Deposition arrows 108 are shown within deposition zone 120 of outer target 104 consisting of material B, deposition arrows 110 are shown within deposition zone 124 of intermediate target 102 consisting of material A and arrows 112 indicate deposition zone 126 of central target 100 which deposits and is formed of material B. Substrate 130 includes film 132 formed of materials sputtered from targets 100, 102 and 104. Film 132 includes portion 134 formed substantially of material A and portion 136 formed substantially of material B. According to this embodiment, a higher power may be supplied to target 102 than to targets 100 or 104 during initial stages of the deposition process, preferentially depositing material A. During latter stages of a continuous deposition process, a higher power is provided to targets 100 and 104 formed of material B, than is provided to intermediate target 102 formed of material A. This produces film 132 which includes a lower portion, portion 134, formed primarily of material A and upper and outer portions, i.e. portion 136, formed primarily of material B. Either or both of materials A and B may be composite materials. Although the illustrated embodiment shows that portion 134 is formed primarily of material A and portion 136 is formed primarily of material B, this is exemplary only. In other embodiments, either or both of portions 134 and 136 may include a homogeneous or other mixture of materials A and B, and materials A and B may be present in various compositional ratios. In still other exemplary embodiments, various other film portions formed of various compositions of materials A and B may be produced.

The deposited film includes a tunable film composition produced by multiple power sources that separately power the associated target arrangements. The relative amounts of power supplied to the target arrangements may be customized to provide a desired film and may be varied in time throughout a continuous or discontinuous deposition process to produce a film with varied characteristics. In one embodiment, a concentration gradient of material A or B or both, may be present from top to bottom of the film.

According to one aspect, the disclosure provides a film deposition system including a deposition chamber with a target arrangement including a plurality of target assemblies therein, each target assembly including a target member and dedicated magnet or set of dedicated magnets, each target assembly having a separately controllable power source and a stage for receiving a workpiece thereon.

According to another aspect, provided is a method for depositing a film on a substrate using physical vapor deposition ("PVD"). The method includes: providing a deposition tool including at least one deposition chamber with a plurality of deposition target assemblies, each including a target member and at least one associated magnet; and depositing a film using physical vapor deposition, by powering a first target assembly of the plurality of target assemblies with a first DC power and by powering a second target assembly of the plurality of target assemblies with a second DC power, the target members formed of different materials.

According to yet another aspect, provided is a method for depositing a film on a substrate using physical vapor deposition ("PVD"). The method includes: providing a first target formed of a first material and a second target formed of a second material; depositing a film by first applying a first power to the first target and a second power to the second target with the first and second powers forming an initial power ratio; and continuing to deposit a film by providing power to the first target and the second target using a different power ratio.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A system comprising:
   a deposition chamber with a target arrangement including a plurality of target assemblies therein, each said target assembly including a target member and at least one magnet having a north pole and a south pole oriented in a plane parallel to a surface of said target member, wherein each of the at least one magnets is an annular magnet having said north pole concentrically positioned within said south pole, each said target assembly having a separately controllable power source.

2. The film deposition system as in claim 1, wherein said plurality of target assemblies includes a central target member and an annular target member surrounding said central target member.

3. The film deposition system as in claim 1, wherein said plurality of target assemblies comprises said target members being concentrically arranged.

4. The film deposition system as in claim 1, wherein each said target member is formed of a different material.

5. The film deposition system as in claim 1, wherein each said at least one magnet is rotatable with respect to said associated target member of said associated target assembly.

6. The film deposition system as in claim 1, wherein said plurality of target assemblies includes a centrally disposed first target assembly, an annular second target assembly surrounding said first target assembly and an annular third target assembly surrounding said second target assembly and wherein each of said plurality of target assemblies is adapted to deposit associated target material on a workpiece.

7. The film deposition system as in claim 1, wherein said plurality of target assemblies are configured such that said target members are adapted to deposit materials on different deposition zones of a workpiece.

8. The film deposition system as in claim 1, wherein said plurality of target assemblies includes a first target assembly having a first separately controllable power source and a second target assembly having a second separately controllable power source, wherein said first separately controllable power source is configured to provide a first power to said first target and said second separately controllable power source is configured to provide a second power to said second target, wherein said first and second powers provide an initial power ratio.

9. The film deposition system as in claim 8, wherein said first separately controllable power source and said second separately controllable power source are configured to adjust said first power and said second power to provide a different power ratio.

10. The film deposition system as in claim 8, wherein said first power is provided by said first separately controllable power source and said second power is provided by said second separately controllable power source simultaneously.

11. The film deposition system as in claim 1, wherein said plurality of target assemblies are concentrically arranged.

12. A system comprising:
    a deposition chamber including a first target member having a first associated magnet arrangement and a second target member having a second associated magnet arrangement, wherein each of the first and second associated magnet arrangements include north and south poles oriented in a plane parallel to a surface of respective first and second target members and having the north pole concentrically positioned within the south pole, wherein the first and second associated magnet arrangements are rotatable with respect to the respective first and second target members.

13. The film deposition system as in claim 12, wherein each of said first target member and said second target member includes a central target member and an annular target member surrounding said central target member.

14. The film deposition system as in claim 12, wherein said first target member and said second target member are concentrically arranged.

15. The film deposition system as in claim 12, wherein said first target member is formed of a first material and said second target member is formed of a second material.

16. The film deposition system as in claim 15, wherein said first target member is configured to deposit said first material in a first zone of the workpiece received on said stage and said second target member is configured to deposit said second material in a second zone of said workpiece received on said stage.

17. The film deposition system as in claim 12, wherein said first target member is coupled a first DC power source and said second target member is coupled to a second DC power source, wherein said first power source is configured to provide a first power to said first target member and said second power source is configured to provide a second power to said second target member.

18. The film deposition system as in claim 17, wherein said first power is and said second power are provided simultaneously.

19. A system comprising:
   a first target member having a first associated magnet arrangement including an annular magnet arrangement having north and south poles oriented in a plane parallel to a surface of the first target member, wherein the north pole is concentrically positioned within the south pole; and
   a second target member having a second associated magnet arrangement, wherein a surface of said first target member and a surface of said second target member are coplanar.

20. The system of claim 19, wherein said first target member and said second target member are concentrically arranged.

* * * * *